United States Patent [19]

Iwabuchi

[11] Patent Number: 5,462,397
[45] Date of Patent: Oct. 31, 1995

[54] PROCESSING APPARATUS

[75] Inventor: Katsuhikō Iwabuchi, Sagamihara, Japan

[73] Assignees: Tokyo Electron Limited; Tokyo Electron Tohoku Limited, both of Japan

[21] Appl. No.: 213,096

[22] Filed: Mar. 15, 1994

[30] Foreign Application Priority Data

Mar. 16, 1993 [JP] Japan .................................. 5-081329

[51] Int. Cl.⁶ .................................................. C23C 16/00
[52] U.S. Cl. .......................... 414/222; 414/217; 414/786; 414/937; 414/939; 414/940; 118/719
[58] Field of Search ................................ 414/217, 222, 414/416, 937, 939, 940, 786; 204/298.25, 298.35; 118/719

[56] References Cited

U.S. PATENT DOCUMENTS

| 4,643,629 | 2/1987 | Takahashi et al. | 414/217 X |
| 4,797,054 | 1/1989 | Arii | 414/217 |
| 4,990,047 | 2/1991 | Wagner et al. | 414/939 X |
| 5,110,248 | 5/1992 | Asano et al. | 414/217 X |
| 5,181,819 | 1/1993 | Sakata et al. | 414/217 |
| 5,221,201 | 6/1993 | Yamaga et al. | 414/937 X |
| 5,273,423 | 12/1993 | Shiraiwa | 414/937 X |
| 5,277,579 | 1/1994 | Takanabe | 414/217 X |
| 5,303,671 | 4/1994 | Kondo et al. | 118/719 |

FOREIGN PATENT DOCUMENTS 17521  1/1988  Japan .................................. 414/937

Primary Examiner—David A. Bucci
Attorney, Agent, or Firm—Graham & James

[57] ABSTRACT

The processing apparatus of the present invention comprises a processing chamber for providing a predetermined processing to a processing object, a transfer chamber having transfer arm for transferring a holding member holding the processing object to/from the processing chamber, inactive gas supply and exhaust pipe for maintaining the inside of the transfer chamber to be in a predetermined inactive gas atmosphere, a holding member containing chamber, provided adjacent to the transfer chamber, having a capacity being capable of containing at least the holding member, and being capable of transferring the holding member to/from the transfer chamber in a state that an atmosphere of the transfer chamber is isolated from outside air, inside atmosphere substituting control for providing substitution so as to set the inside of the holding member containing chamber to be in a vacuum atmosphere or a predetermined inactive gas atmosphere, and an processing object transfer chamber, provided to be adjacent to the holding member containing chamber, having transfer arm for transferring the processing object to the holding member of the holding member containing chamber.

12 Claims, 4 Drawing Sheets

PROCESSING APPARATUS

BACKGROUND OF THE INVENTION

1. Field of the Invention

The present invention relates to a processing apparatus for providing a predetermined processing to a processing object such as a semiconductor wafer.

2. Description of the Related Art

There have been known various types of processing apparatus for providing a predetermined processing to a processing object. For example, in a semiconductor manufacturing process, there have been used various types of processing apparatus for providing processings such as forming an oxide film on a processing object such as a semiconductor wafer (hereinafter simply called as wafer), forming a thin film by a thermal CVD, or forming an impurity concentration region by a thermal diffusion method.

As such a processing apparatus, the processing apparatus of a horizontal type is conventionally used, and the processing apparatus of a vertical type has been often used in recent years. In the processing apparatus of the vertical type, in a state that a wafer boat containing a large number of wafers is inserted into substantially a cylindrical heated processing tube (hereinafter called as process tube) in a high temperature atmosphere, a predetermined process gas is introduced to the process tube, so that various types of processings can be provided to the wafer.

FIG. 4 shows one example of the processing apparatus of the vertical type. As shown in the figure, a manifold 2 is provided below a process tube 1 made of quartz. Gas can be supplied and exhausted to/from the process tube 1 by an exhaust pipe 3 and a gas supply tube 4 provided in the manifold 2. In the outside of the process tube 1, cylindrical heaters 5 are provided to enclose the process tube 1. By use of the heaters 5, the inside of the process tube 1 can be controlled to a desired temperature. The wafer boat 7 containing the large number of wafers W is inserted into the process tube 1 from a transfer chamber 10 by a boat elevator 11a constituting a transfer mechanism. Then, a flange 7a of the wafer boat 7 is brought in contact with a flange section 2a of the manifold 2 in a sealed state, so that the process tube 1 is closed.

In the load lock chamber 140 provided adjacent to the transfer chamber 140, there are provided wafer carrier C and wafer transfer means 150. The wafer carrier C is transferred by wafer transfer means 150. The transfer means 150 is used to transfer the wafer W contained in the wafer carrier C to the wafer boat 7, or transfer the wafer W mounted on the wafer boat 7 to the wafer carrier C.

For providing a predetermined processing to the wafer W by use of the above-structured processing apparatus, the wafer carrier C is transferred to the load lock chamber 140 through a front door 21 by carrier transfer means. Then, the wafer W contained in the wafer carrier C is stored in the wafer boat 7 through a rear door 22 by wafer transfer means 150 in a state that the inside of the load lock chamber 140 is isolated from outside air, for example, under an inactive gas atmosphere such as nitrogen ($N_2$) (non-oxygen atmosphere). Thereafter, the wafer boat 7 is lifted by the elevator 11a and transferred to the process tube 1, and the process tube 1 is maintained to be in an air-tight state. Thereafter, gas of the process tube 1 is exhausted through the exhaust pipe 3, and the inside of the process tube 1 is set to be a predetermined vacuum state. If the inside of the process tube 1 reaches the predetermined vacuum state, process gas is introduced to the process tube 1 through the gas supply pipe 4, and a desired processing is provided to the wafer W. After processing, the process gas of the process tube 1 is exhausted through an exhaust pipe 3, and the inside of the process tube 1 is set to be a predetermined vacuum state. Thereafter, $N_2$ gas is introduced to the process tube 1 through the gas supply pipe 4. Then, at the time when $N_2$ gas pressure of the process tube 1 is the same as $N_2$ gas pressure of the transfer chamber 10, the wafer boat 7 is moved down, and the wafer boat 7 is transferred from the process tube 1. Then, by wafer transfer means 150, the processed wafer W, which is set to the wafer boat 7, is contained in the wafer carrier C of the load lock chamber 140.

In the processing by use of the above processing apparatus of the vertical type, a portion close to an opening section of the process tube 1 is in a considerable high temperature atmospheric state when the wafer W is transferred with the wafer boat 7 from the transfer chamber 10 to the process tube 1 or the wafer W is transferred with the wafer boat 7 from the process tube 1 after processing. Due to this, if air exists there, there is a problem in that a natural oxide film is formed on a surface of the wafer W by oxygen ($O_2$) of air.

Also, in this type of the processing apparatus for repeating the processing of the wafer W, gaseous impurities such as carbon are generated in the transfer chamber 10, or particle impurities such as oil mist or dust are easily generated. Therefore, if these impurities exist in the transfer chamber 10, impurities are adhered to the wafer W or a chemical reaction occurs, and a characteristic of the semiconductor element is deteriorated, or yield is lowered.

Moreover, the temperature in $N_2$ gas atmosphere of the transfer chamber 10 is abnormally increased by bleedoff of hot air from the process tube 1 or radiant heat from the the processed wafer W heated at a high temperature.

In consideration of the above problems, in a state that the transfer chamber 10 is maintained in an air-tight state, the wafer boat 7 is transferred to/from the process tube 1 under an inactive gas atmosphere (non-oxygen atmosphere) such as $N_2$ gas, and air of the transfer chamber 10 is always changed. Thereby, the inside of the transfer chamber 10 is maintained in a clean atmosphere that no atmospheric air enters. Also, the transfer chamber 10 is prevented from being filled with hot air. More specifically, in order to prevent air from entering from the outside, the atmosphere of the transfer chamber 10 is always maintained to be positive pressure. Also, clean inactive gas, serving as purge gas, is always introduced to the transfer chamber 10 through a gas supply pipe 12, while inactive gas of the transfer chamber 10 are always exhausted to the outside through an exhaust pipe 13 together with impurities, and the inactive gas atmosphere of the transfer chamber 10 is maintained to be positive pressure and high purity.

However, even if only the transfer chamber 10 is maintained to be positive and high purity, the above-mentioned problems cannot be fully solved if the circulation of outside air to the load lock chamber 140 which the wafer W is transferred to/from is left as it is. Due to this, the following method is used.

More specifically, at the time when the wafer carrier C stored in the wafer W is transferred to the load lock chamber 140, the front door 21 is closed, and the inside of the load lock chamber 140 is closed. Thereafter, air left in the load lock chamber 140 is exhausted, and atmosphere of the load lock chamber 140 is purged by inactive gas. According to this method, the wafer W is transferred to the chamber 10 from the load lock chamber 140 through the rear door 2 in a clean atmosphere where inactive gas is substituted for air.

By the way, normally, the wafer carrier C can store a plurality of wafers W such as 25 wafers W. Also, the wafer boat 7 can store 50 to 100 wafers W. Therefore, in a case that the wafer boat 7 can store 100 wafers W and the wafer carrier C can store 25 wafers W, it is needed that four wafer carriers C be set in a standby state in the load lock chamber 140 in transferring the wafers W to the wafer boat 7 of the transfer chamber 10 from the load lock chamber 140. Also, since wafer transfer means 150 is also provided in the load lock chamber 140, the load lock chamber 140 has inevitably a large capacity. Only if the transfer chamber 10 is maintained to be positive pressure and high purity as the supply and exhaust of inactive gas to/from the transfer chamber 10 are always performed, a large quantity of inactive gas is consumed. In addition to this, if atmosphere of the load lock chamber 140 having a large capacity is purged by inactive gas, the total amount of consumption of inactive gas becomes considerable. From an economical viewpoint, this processing costs much, and is unfavorable. In actual, the transfer chamber 10 and the load lock chamber 140, which have about 1 meter in depth and about 2 meters in height, are largely box-shaped. Due to this, for substitute inactive gas for air of the inside of each of these chambers at first, a large amount of inactive gas must be introduced thereto, it takes much time to perform a sufficient gas substitution, and efficiency of processing is lowered. To solve this problem, there can be considered a method in which the inside of each of the transfer chamber 10 and the load lock chamber 140 is vacuumed by a vacuum pump and inactive gas is newly introduced into these chambers. However, according to this method, it is required that a housing panel structure of the apparatus body including the transfer chamber 10 and the load lock chamber 140 be made of steel having high airtightness and thickness enough to withstand negative pressure. Due to this, increase in manufacturing cost may be brought about.

Moreover, the wafer carrier C is exposed in air before being transferred to the load lock chamber 140, and is put in a an easily contaminated state. Due to this, the inside of the load lock chamber 140 is purged in a state that the contaminated wafer carrier C is transferred to the load lock chamber 140. Therefore, the above method is not a favorable method in improving the purge effect.

SUMMARY OF THE INVENTION

An object of the present invention is to provide a processing apparatus in which quantity of consumption of inactive gas can be reduced and a natural oxide film can be prevented from being formed on a surface of a processing object, and impurity materials can be prevented from being adhered to the surface of the processing object.

The object of the present invention can be attained by the following processing apparatus.

More specifically, according to the present invention, there is provided a processing apparatus of the present invention comprises a processing chamber for providing a predetermined processing to a processing object; a transfer chamber having transfer means for transferring a holding member holding the processing object to/from the processing chamber; inactive gas supply and exhaust means for maintaining the inside of the transfer chamber to be in a predetermined inactive gas atmosphere; a holding member containing chamber, provided adjacent to the transfer chamber, having a capacity being capable of containing at least the holding member, and being capable of transferring the holding member to/from the transfer chamber in a state that an atmosphere of the transfer chamber is isolated from outside air; inside atmosphere substituting means for providing substitution so as to set the inside of the holding member containing chamber to be in a vacuum atmosphere or a predetermined inactive gas atmosphere; and an processing object transfer chamber, provided to be adjacent to the holding member containing chamber, having transfer means for transferring the processing object to the holding member of the holding member containing chamber.

According to the above structure, the holding member containing chamber has preferably a minimum capacity, which can contain only the holding member. This can be attained by providing a transfer mechanism for transferring the holding member from transfer means of the transfer chamber to the holding member containing chamber in the transfer chamber. Thereby, the space of the holding member containing chamber can be set to a minimum space where the holding member can be contained. Also, in substitution, the inside of the holding member containing chamber can be rapidly set to a vacuum atmosphere or an inactive gas atmosphere, and a processing ability of the processing object can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

One embodiment of the present invention will be explained with reference to the drawings.

Figure 1:
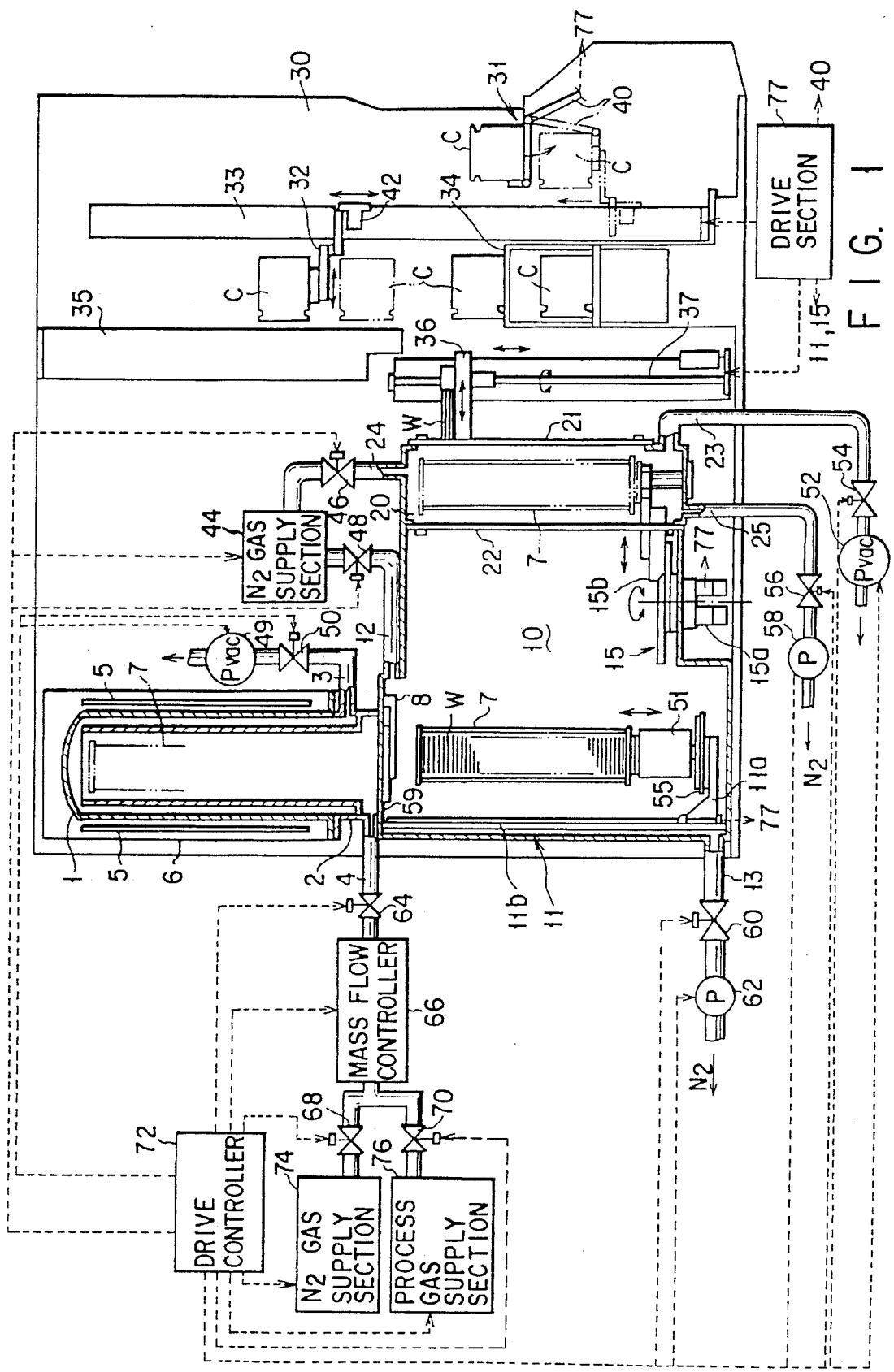
FIG. 1 is a schematic structural view of a processing apparatus of one embodiment of the present invention.
Figure 2:
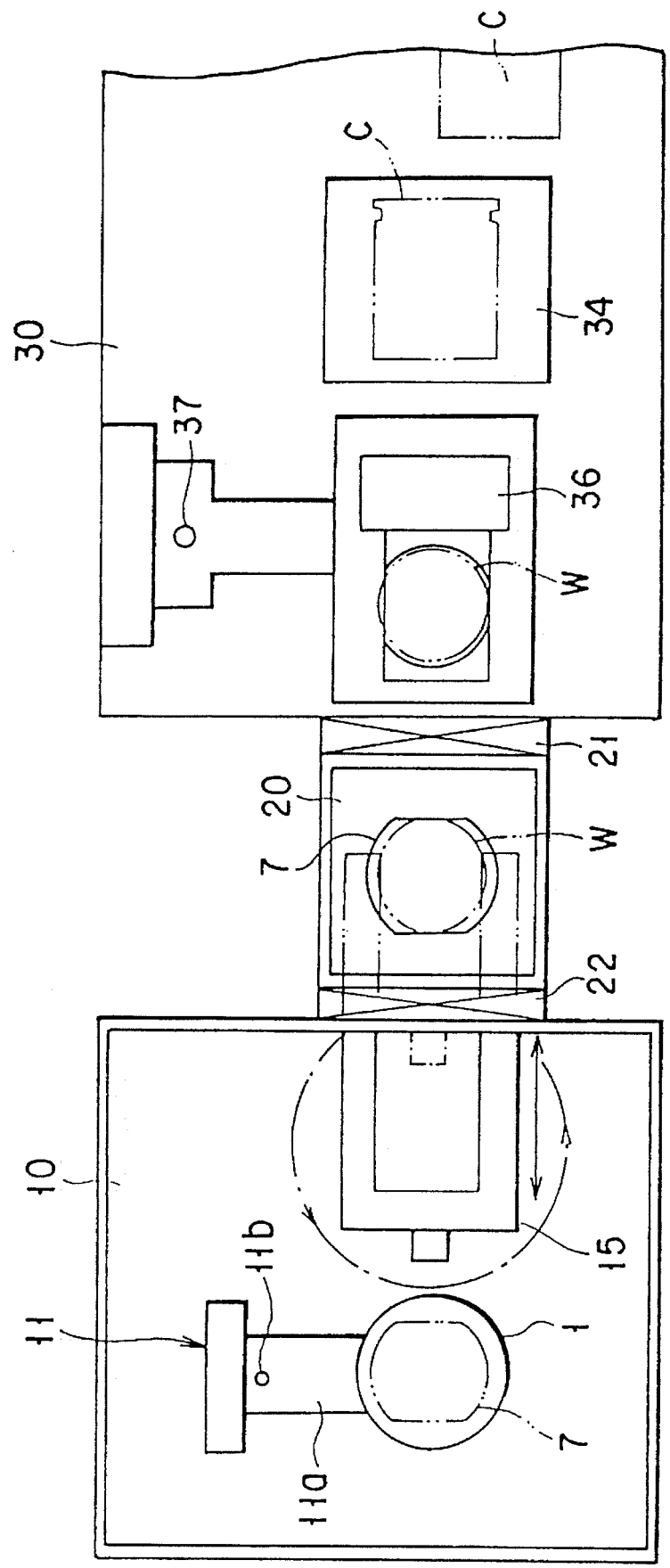
FIG. 2 is a schematic plane view of the processing apparatus of FIG. 1.

FIG. 1 shows the structure of a processing apparatus of a vertical type for processing semiconductor wafers of one embodiment of the processing apparatus of the present invention.

As shown in the figure, the processing apparatus of this embodiment comprises a process tube 1, a close-structured transfer chamber 10, a wafer transfer chamber 30, and a wafer boat containing chamber (holding member containing chamber) 20. The process tube 1 is used as a process chamber to provide a predetermined processing to a processing object, that is, wafers W. The transfer chamber 10 comprises an elevating mechanism 11 for detachably inserting a wafer boat 7, serving as a holding member, which can contain a large number of wafers W, such as 100 wafers W, to the process tube 1, and a transfer mechanism 15 to be described later. The wafer transfer chamber 30 transfers the wafers W contained in the wafer carrier C to the transfer chamber 10. The wafer boat containing chamber 20 is provided to be adjacent to the transfer chamber 10 and the wafer transfer chamber 30, and constitutes a load lock chamber having a minimum capacity which can contain only the wafer boat 7.

A front auto door 21 and a rear auto door 22 are provided between the wafer boat chamber 20 and the wafer transfer chamber 30 and between the wafer boat chamber 20 and the chamber 10, respectively. If the front auto door 21 and the rear auto door 22 are closed, the inside of the wafer boat containing chamber 20 is maintained to be an airtight stated. A vacuum pipe 23, an $N_2$ gas supply pipe 24, and an $N_2$ gas exhaust pipe 25 are respectively coupled to the wafer boat containing chamber 20. The vacuum pipe 23 is connected to a vacuum pump 52 through an opening and closing valve 54. The $N_2$ gas supply pipe 24 is connected to an $N_2$ gas supply section 44 through an opening and closing valve 46. The $N_2$ gas exhaust pipe 25 is connected to a suction pump 58 through an opening and closing valve 56. Therefore, the inside of the wafer boat containing chamber 20 can be substituted to a predetermined vacuum atmosphere or an inactive gas atmosphere such as $N_2$ gas. The drive of each of the pumps 52 and 58, and the N2 gas supply section 44, and the opening and closing operation of each of the valves 46, 54, and 56 are controlled by a drive control section 72.

Figure 3:
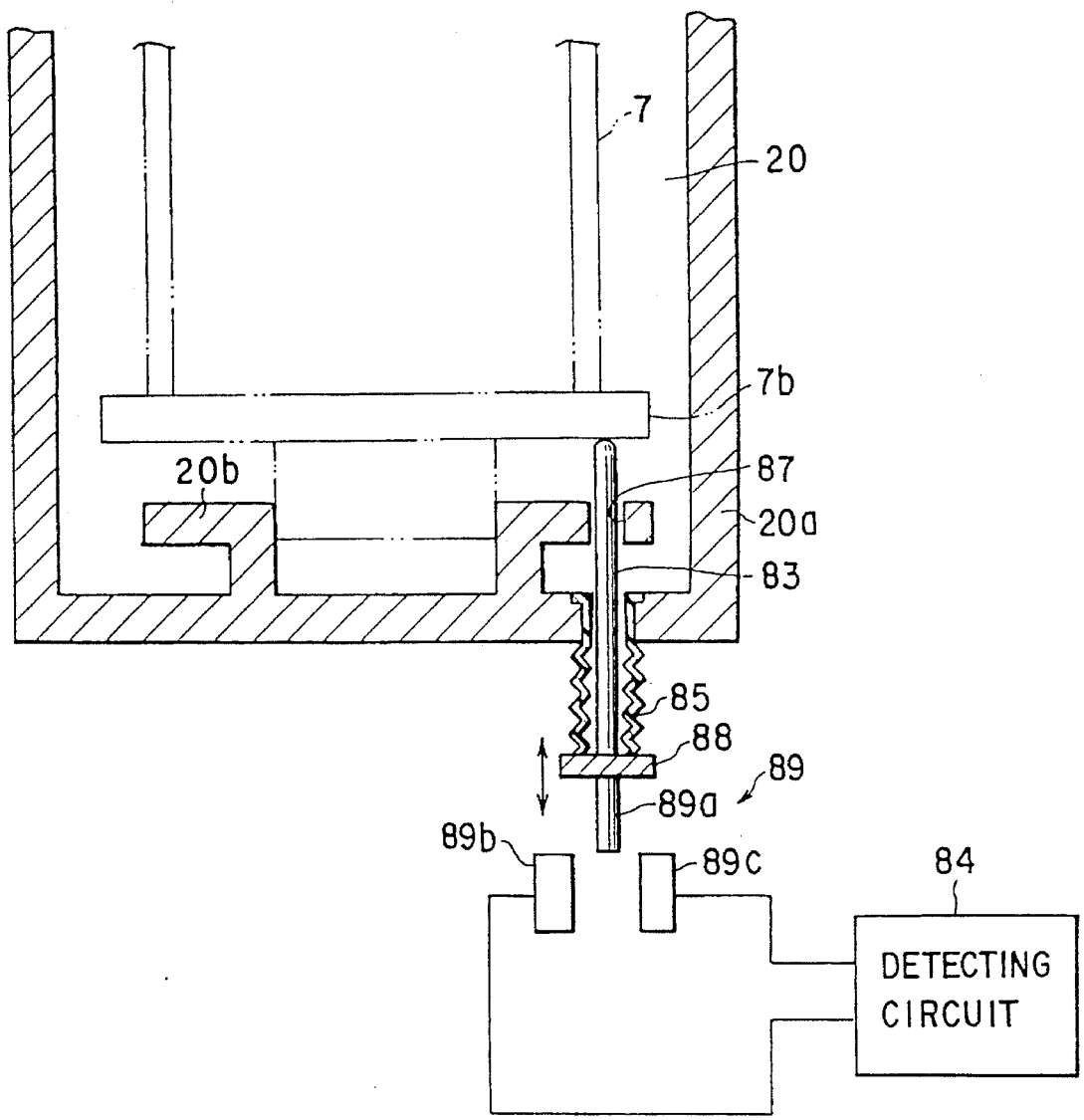
FIG. 3 is a cross sectional view of a bottom section of a chamber for containing a holding member.
Figure 4:
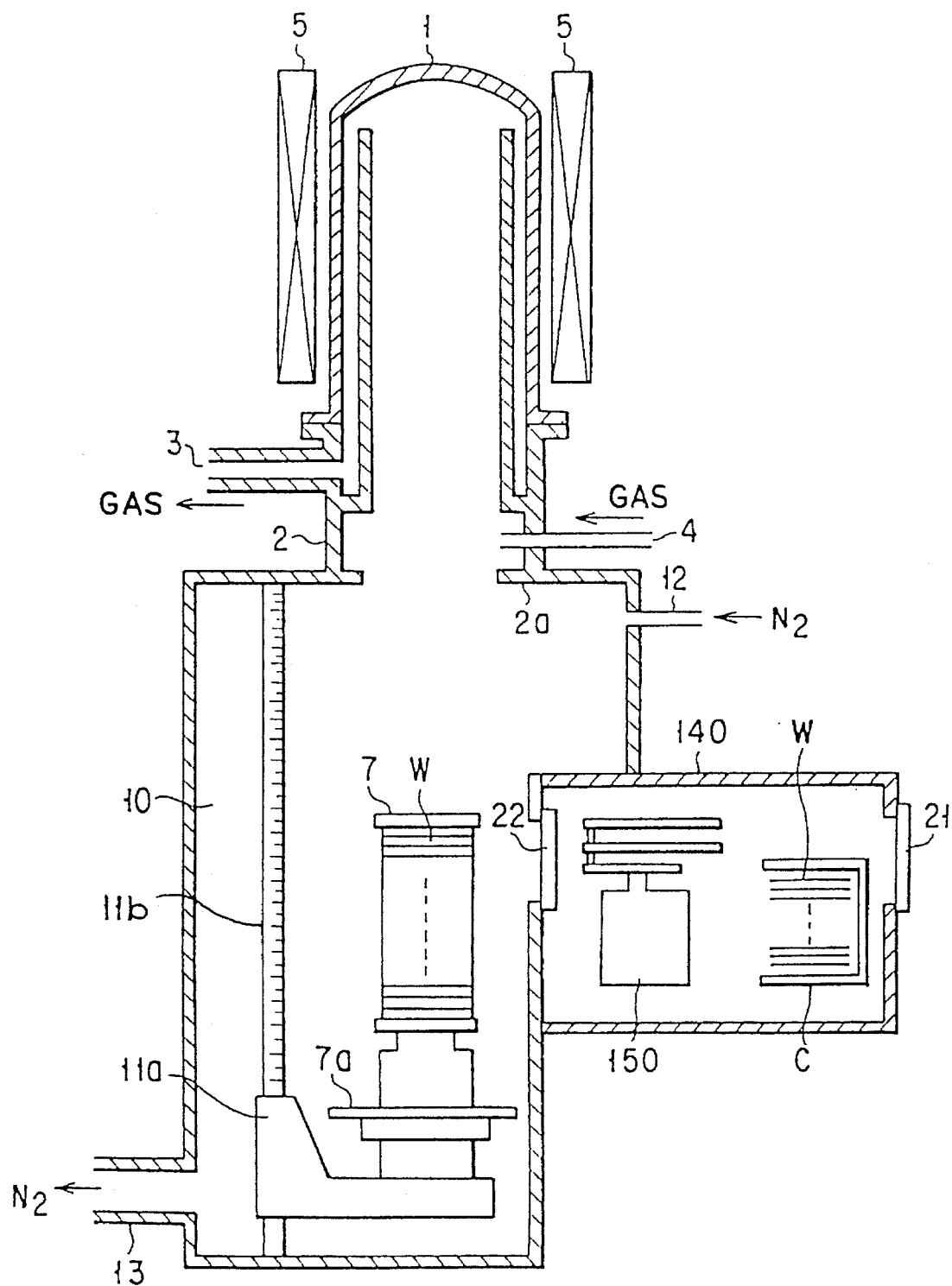
FIG. 4 is a cross sectional view of a conventional processing apparatus.

As shown in FIG. 3, in the bottom of the wafer boat containing chamber 20, bellows 85, which are coupled to the bottom in a sealing state, a pin 83 are movably provided through a connection plate 88 connected to a lower end of the bellows 85 in a sealing state. In a state that the bellows 85 are held to be in a natural length, that is a standby state, the upper end of the pin 83 is projected from an upper surface of a wafer boat board mount base 20b through a hole 87 provided in the flange-shaped wafer boat mount base 20b projected to the inside of the wafer boat containing chamber 20 (the wafer boat mount base 20b is formed to be integral with a housing 20a forming the wafer boat containing chamber 20). In the lower side of the bellows 85, there is provided detecting means 89 for detecting the presence of the wafer boat 7.

The detecting means 89 comprises a movable detecting member 89a and an optical sensor. The movable detecting member 89a is coupled to the connection plate 88. The optical sensor is provided at a lower side than the position of the movable detecting member 89a, and is formed of a pair of light emitting section 89b and a light receiving section 89c, which is provided to sandwich the upper and lower moving passages of the movable detecting member 89a. In this case, the pair of the light emitting section 89b and the light receiving section 89c is connected to a detecting circuit 84. Therefore, if the wafer boat 7 is contained in the wafer boat containing chamber 20, and the wafer boat 7 is mounted on the wafer boat mount base 20b, the pin 83, which is projected from the upper surface of the wafer boat mount base 20b, is pressed downward by a bottom section 7b of the wafer boat 7, the bellows 85 are extended through the connection plate 88 and a movable detecting member 89a coupled to the connection plate 88 is moved down, and light to a light receiving section 89c from a light emitting section 89b is interrupted by the movable detecting member 89a. The interruption of light to the light receiving section 89c from the light emitting section 89b is detected by the detecting circuit 84, so that it is detected that the wafer boat 7 is set in the wafer boat containing chamber 20. It is not always necessary to detect the presence of the wafer boat 7 by such detecting means 89. For example, it is possible to detect the presence of the wafer boat 7 by arbitrary detecting means such as a sensor, which is buried in a ceiling, a floor, or a wall of the wafer boat containing chamber 20 through a seal mechanism.

As shown in FIG. 1 the process tube 1 is formed of quartz, and is structured as a cylindrical container of a vertical type having a reverse U-shaped cross section. At the outside of the process tube 1, heaters 5 are provided to enclose the process tube 1. The process tube 1 and the heaters 5 are coated with a projection cover 6 into which a cooling pipe and an insulation material are incorporated. A manifold 2 is coupled to a lower opening end of the process tube 1. The manifold 2 is cylindrically formed to have a flange on its upper and lower portions. A gas supply pipe 4 and an exhaust pipe 3 are connected to a peripheral wall section of the manifold 2. The gas supply pipe 4 is used to introduce a predetermined processing gas to the process tube 1, and the exhaust pipe 3 is used to exhaust the processed gas from the process tube 1. The gas supply pipe 4 is connected to $N_2$ gas supply section 74 and a process gas supply section 76 through gas change valves 68 and 70. Thereby, process gas and $N_2$ gas can be selectively introduced to the process chamber 1. At the portion of the gas supply pipe 4, which is located at the lower side than the gas change valves 68 and 70, a mass flow controller 66 is provided. By the mass flow controller 66, the amount of process gas or $N_2$ to be supplied to the process tube 1 can be arbitrarily controlled. Also, the supply of gas to the process tube 1 can be stopped by an opening and closing valve 64. The exhaust pipe 3 is connected to a vacuum pump 49 through an opening and closing value 50. The drive of each of the $N_2$ gas supply section 74, process gas supply 76, mass flow controller 66, and vacuum pump 49, and the opening and closing operation of each of the valves 50, 64, 68, and 70 are controlled by a drive controller 72.

The transfer chamber 10 has a closing structure in which, for example, a stainless steel panel is welded to the entire periphery or sealed thereto by an O-ring seal. At the suitable position of each of the upper and lower portions of the transfer chamber 10, an $N_2$ gas supply tube 12 and an $N_2$ gas exhaust pipe 13 are coupled. The $N_2$ gas supply pipe 12 is connected to an $N_2$ gas supply section 44 through an opening and closing valve 48. The $N_2$ gas exhaust pipe 13 is connected to a suction pump 62 through an opening and closing valve 60. Thereby, clean inactive gas ($N_2$ gas), serving as purge gas, is always introduced to the transfer chamber 10 through the gas supply pipe 12, while the inactive gas of the transfer chamber 10 are always exhausted to the outside through the exhaust pipe 13 together with impurities, and the inactive gas atmosphere of the transfer chamber 10 is maintained to be positive pressure and high purity. The drive of the pump 62 and the opening and closing operation of each of the valves 48 and 60 are controlled by a drive control section 72.

The elevating mechanism 11 provided in the transfer chamber 10 comprises a board elevator 11a mounting the wafer boat 7 and holding the wafer boat 7, and a ball screw device 11b for moving up and down the boat elevator 11a. According to the present invention, since it is not needed that the transfer chamber 10 be set to be in a vacuum state (to be described later), it is unnecessary to provide high rigidity to the panel forming the transfer chamber 10.

Therefore, the ball screw device 11b of the elevating mechanism 11 is not needed to be free-standing type, and the ball screw device 11b may be fixed to the wall of the transfer chamber 10.

At the side of the wafer board containing chamber of the transfer chamber 10, there is provided a transfer mechanism 15 for transferring the wafer boat 7 between the board elevator 11a of the elevating mechanism 11 and the wafer boat board containing chamber 20. The transfer mechanism 15 comprises a drive section 15a for horizontally rotating and elevating, which is provided in the outer section of the transfer chamber 10, and a multi-joint arm 15b for holding the wafer boat 7 and being connected with transmission shaft of the drive section 15, which is positioned in the transfer chamber 10. Also, on the opening section of the process tube 1 positioned at the upper portion of the transfer chamber 10, there is provided an auto shutter 8, which opens and closes the opening section. By closing the auto shutter 8, radiant heat can be prevented from being transmitted to the transfer chamber 10 from the process tube 1.

The wafer transfer chamber 30 is provided in a clean room (not shown) under the atmosphere through an HEPA filter. In the wafer transfer chamber 30, there is provided an I/O port 31, which can mount the wafer carrier C containing a plurality of wafers such as 25 wafers. In the I/O port 31, two position changing mechanism 40 are provided right and left, respectively. The position changing mechanism 40 can perform the position changing operation of the wafer carrier C. Specifically, the mechanism 40 turns the wafer carrier C, which is upward mounted on the upper surface of the position changing mechanism 40 (state that the wafer W is upright maintained as shown by a solid line of FIG. 1), at 90° to change to be in a horizontal state (shown by two-dotted chain line of FIG. 1). Conversely, the wafer carrier C is changed from the horizontal state to the upward state by the mechanism 40.

In the wafer transfer chamber 30, a carrier transfer 32 is provided at a right back side of the I/O port 31 so as to be elevated through an elevator 33. A transfer stage 34 is provided at the back side of the carrier transfer 32, and a carrier stock stage is provided at the upper portion of the transfer stage 34. The carrier transfer 32 can move up and down in accordance with the elevating operation of an elevating device 42 of the elevator 33. Then, the carrier transfer 32 can receive the wafer carrier C, which is changed to be the horizontal state by the position changing mechanism 40, by use of the multi-joint arm, and transfer the wafer carrier C to the carrier stock stage 35. The carrier stock stage 35 is formed as a plurality of shelves, which can stock the wafer carriers C transferred from the carrier transfer 32 in the form of two columns and four stages in the horizontal state.

At the side of the wafer board containing chamber 20 of the wafer transfer chamber 30, a wafer transfer 36 is supported to be elevated by an elevator 37 for mount. The wafer transfer 36 takes up the wafers W of the wafer carrier C on the transfer stage 34 one by one while being elevated. Then, the wafer transfer 36 can hold the storage of the wafer boat 7 contained in the wafer boat containing chamber 20, or inversely, return the wafers W from the wafer boat 7 to the wafer carrier C on the transfer stage 34. The drive of each of the above-explained transfer devices 11, 15, 31, 33, 36, and 40 are controlled by a drive section 77.

The following will explain an operation of the above-structured processing apparatus.

First, the wafer carrier C is transferred onto the transfer stage 34. In a state that the wafer boat 7 is contained in the wafer boat containing chamber 20, the front auto door 21 of the wafer boat containing chamber 20 is opened, and the wafer boat containing chamber 20 and the wafer transfer chamber 30 are communicated with each other. At this time, the inside of the wafer boat containing chamber 20 and that of the wafer transfer chamber 30 are in the atmosphere. Under this state, the wafers W of the wafer carrier C on the transfer stage 34 is contained in the wafer boat 7 of the wafer boat containing chamber 20 by the wafer transfer 36. Then, the predetermined number of wafers W are contained in the wafer boat 7. Thereafter, the front auto door 21 is closed, and the inside of the wafer board containing chamber 20 is held in an airtight state. Next, the vacuum pump 52 is operated such that the inside of the wafer boat containing chamber 20 is set to a predetermined vacuum state through the vacuum pipe 23. Or, the $N_2$ gas supply section 44 is operated such that N2 gas is exhausted together with air by the exhaust pipe 25 as $N_2$ gas is supplied to the wafer boat containing chamber 20 by the $N_2$ gas supply pipe 24 under normal pressure or reduced pressure. Thereby, the wafer boat 7 and the wafers W are completely isolated from air, and the natural oxide film is prevented from being formed on the wafers W.

In a case that the inside of the wafer boat containing chamber 20 is set to a predetermined vacuum state, $N_2$ gas is introduced to the wafer boat containing chamber 20 from the $N_2$ gas supply section 44 through the $N_2$ gas supply pipe 24. Then, the rear auto door 22 is opened in a state that the inside of the wafer boat containing chamber 20 is set to the same atmosphere as the transfer chamber 10 to which the $N_2$ gas is always introduced. Thereafter, the transfer mechanism 15 is driven, and the wafer boat 7 in which the wafers W set in the wafer boat containing chamber 20 is contained is transferred on a temperature holding cylinder 51 mounted on the boat elevator 11a, and maintained.

Then, if the wafer boat 7 is set on the boat elevator 11a, the boat elevator 11a rises, and the wafer boat 7 is transferred to the process tube 1. At this time, a flange 55 provided in the lower portion of the wafer boat 7 contacts a flange 59 provided in the lower portion of the manifold 2, and the inside of the process tube 1 is airtightly closed. Under this state, the $N_2$ gas of the process tube 1 is exhausted through the exhaust tube 3, and the inside of the process tube 1 is set to a predetermined vacuum state. In the vacuum setting operation, the opening and closing valve 64 is set to be in a closing state, and the opening and closing valve 50 is opened, and the vacuum pump 49 is driven. When the inside of the process tube 1 reaches the predetermined vacuum state, the process gas is introduced to the process tube 1 through the gas supply pipe 4, and a desired processing is provided to the wafers W. In this operation, the gas change valve 70 and the opening and closing valve 64 are opened in the state that the opening and closing valve 50 and the gas change valve 68 are closed, and the process gas supply section 76 is driven. At this time, the mass flow controller 66 is of course set to the predetermined operating state. After processing, the opening and closing valve 64 is closed, and process gas of the process tube 1 is exhausted through the exhaust tube 3, and the inside of the process tube 1 is set to the predetermined vacuum state. Thereafter, the gas change valve 68 and the opening and closing valve 64 are opened in a state that the opening and closing valve 50 and the gas change valve 70 are closed and the $N_2$ gas supply section 74 is driven, and the $N_2$ gas is introduced to the process tube 1 through the gas supply pipe 4. Then, at the time when $N_2$ gas pressure of the process tube 1 reaches the same as that of the transfer chamber 10, the wafer boat 7 is moved down through the elevating mechanism 11, and the wafer boat 7 is transferred from the process tube 1. Thereafter, by the process opposite to the above-mentioned transfer process, the processed wafer W is returned to the carrier C, which is in a standby state on the transfer stage 34 of the wafer transfer chamber 30.

As mentioned above, the main feature of the processing apparatus of this embodiment lies in the point that the wafer boat containing chamber 20 is structured as the load lock chamber having the minimum capacity, which can contain only the wafer boat 7. In other words, the inside of the wafer boat containing chamber 20 can be changed from the atmospheric air to the vacuum atmosphere or a predetermined gas atmosphere. Also, since the wafer boat containing chamber 20, serving as the load lock chamber, is formed to have a minimum capacity, which can contain only the wafer boat 7, much time is not required for gas substitution, and the quantity of the inactive gas consumption may be low. Therefore, the processing apparatus of this embodiment is structured such that an extremely clean atmosphere can be easily made. According to the above embodiment, the elevating mechanism 11 and the transfer mechanism 15 are provided in the transfer chamber 10 in order that the wafer boat containing chamber 20 is formed to have the minimum capacity, which can contain only the wafer boat 7. Also, according to the processing apparatus of the above embodiment, unlike the conventional apparatus, since the wafer carrier C, which may be strongly contaminated, is provided not to be transferred to the wafer boat containing chamber 20, the purge effect can be increased.

As mentioned above, according to this embodiment, the wafer boat containing chamber 20 is structured to have a small capacity and exclude all factors of generating contamination, so that the extremely clean atmosphere can be easily made. Due to this, the wafers W can be transferred to the transfer chamber 10 from the wafer boat containing chamber 20 in the clean atmosphere in which air is substituted for the inactive gas. Unprocessed wafers W, which is transferred to the process tube 1 from the wafer transfer chamber 30, is once transferred to the the wafer boat containing chamber 20. Thereby, since the unprocessed wafers W can be exposed in the vacuum atmosphere which is isolated from air, the natural oxide film can be prevented from being formed on the surface of the wafers W, and impurity materials can be prevented from being adhered to the surface of the wafers W. Moreover, in this case, since only the wafer boat containing chamber 20 having a small capacity may be set in a vacuum state, the wafers can be set in the vacuum atmosphere, and the reduction of processing time can be improved.

The above embodiment explained the case that the transfer chamber 10, the wafer boat containing chamber 20, and the wafer transfer chamber 30 are linearly arranged. The transfer chamber 10, the wafer boat containing chamber 20, and the wafer transfer chamber 30 are not necessarily linearly arranged. If the wafer boat containing chamber 20 is provided between the transfer chamber 10 and the wafer transfer chamber 30, the arrangement may be arbitrarily set. Moreover, the above embodiment explained the case of the processing apparatus of the semiconductor wafer. The present intention can be, of course, applied to a thermal processing of a processing object such as a glass substrate and an LCD substrate other than the semiconductor wafer and the processing apparatus other than thermal processing.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A processing apparatus comprising:

a processing chamber for providing a predetermined processing to a processing object;

a transfer chamber having transfer means for transferring a holding member holding the processing object to/from said processing chamber;

inactive gas supply and exhaust means for maintaining inside of said transfer chamber to be in a predetermined inactive gas atmosphere;

a holding member containing chamber, provided adjacent to said transfer chamber, and having a capacity being capable of containing at least said holding member, said transfer means being capable of transferring said holding member to/from the transfer chamber in a state that an atmosphere of the transfer chamber is isolated from outside air;

inside atmosphere substituting means for providing substitution so as to set inside of said holding member containing chamber to be in a vacuum atmosphere or a predetermined inactive gas atmosphere; and a processing object transfer chamber, provided to be adjacent to said holding member containing chamber, having transfer means for transferring the processing object to the holding member of said holding member containing chamber.

2. The apparatus according to claim 1, wherein said holding member containing chamber has a minimum capacity being capable of containing only said holding member.

3. The apparatus according to claim 1, further comprising a transfer mechanism, provided in said transfer chamber, for transferring said holding member between transfer means of said transfer chamber and said holding member containing chamber.

4. The apparatus according to claim 1, wherein said inactive gas supply/exhaust means comprises an inactive gas supply section, a gas supply pipe for supplying inactive gas from the inactive gas supply section to said transfer chamber, and an exhaust pipe for exhausting inactive gas of said transfer chamber outside.

5. The apparatus according to claim 1, wherein said inside atmosphere substituting means comprises an inactive gas supply section, a gas supply pipe for supplying inactive gas from the inactive gas supply section to said holding member containing chamber, an exhaust pipe for exhausting inactive gas of said holding member containing chamber outside, a vacuum pipe being capable of exhausting gas of said transfer chamber up to a predetermined vacuum state, and control means for controlling respective flow in said gas supply pipe, exhaust pipe and vacuum pipe.

6. The apparatus according to claim 1, further comprising detecting means, provided in said holding member containing chamber, for detecting the presence of the holding member in said holding member containing chamber.

7. A processing apparatus comprising:

a processing chamber for providing a predetermined processing to a processing object;

a transfer chamber having transfer means for transferring a holding member holding the processing object to/from said processing chamber;

inactive gas supply and exhaust means for maintaining inside of said transfer chamber to be in a predetermined inactive gas atmosphere;

a holding member containing chamber, provided adjacent to said transfer chamber, and having a minimum capacity being capable of containing only said holding member, said transfer means being capable of transferring said holding member to/from the transfer chamber in a state that an atmosphere of the transfer chamber is isolated from outside air;

inside atmosphere substituting means for providing substitution so as to set inside of said holding member containing chamber to be in a vacuum atmosphere or a predetermined inactive gas atmosphere;

a transfer mechanism, provided in said transfer chamber, for transferring said holding member between transfer means of said transfer chamber and said holding member containing chamber; and a processing object transfer chamber, provided adjacent to said holding member containing chamber, having transfer means for transferring said processing object to said holding member containing chamber and setting means for setting said processing object transferred by said transfer means to the holding member of said holding member containing chamber.

8. The apparatus according to claim 7, wherein said inactive gas supply/exhaust means comprises an inactive gas supply section, a gas supply pipe for supplying inactive gas from the inactive gas supply section to said transfer chamber, and an exhaust pipe for exhausting inactive gas of said transfer chamber outside.

9. The apparatus according to claim 7, wherein said inside atmosphere substituting means comprises an inactive gas supply section, a gas supply pipe for supplying inactive gas from the inactive gas supply section to said holding member containing chamber, an exhaust pipe for exhausting inactive gas of said holding member containing chamber outside, a vacuum pipe being capable of exhausting gas of said holding member containing chamber up to a predetermined vacuum state, and a valve mechanism for individually opening and closing said gas supply pipe, exhaust pipe and vacuum pipe.

10. The apparatus according to claim 7, further comprising detecting means, provided in said holding member containing chamber, for detecting the presence of the holding member in said holding member containing chamber.

11. A processing method comprising the steps of:

transferring a processing object to a holding member containing chamber containing a holding member;

setting inside of said holding member containing chamber to a vacuum atmosphere so that said holding member containing chamber is isolated from outside air;

introducing an inactive gas into said holding member containing chamber;

transferring said holding member of said holding member containing chamber to a transfer chamber having a certain level of inactive gas atmosphere when atmosphere of the holding member containing chamber reaches a level substantially equal to that of the transfer chamber;

transferring said holding member of said transferring chamber to a processing chamber; and providing a predetermined processing to said processing object contained in said holding member in said processing chamber.

12. A processing method comprising the steps of:

transferring a processing object to a holding member containing chamber containing a holding member;

introducing an inactive gas into said holding member containing chamber and isolating said holding member containing chamber from outside air;

transferring said holding member of said holding member containing chamber to a transfer chamber having a predetermined level of the inactive gas atmosphere when the atmosphere of the holding member containing chamber reaches a level substantially equal to that of the transfer chamber;

transferring said holding member of said transferring chamber to a processing chamber; and providing a predetermined processing to said processing object contained in said holding member in said processing chamber.

* * * * *